(12) United States Patent
Wu et al.

(10) Patent No.: US 11,783,713 B2
(45) Date of Patent: Oct. 10, 2023

(54) METHOD AND DEVICE FOR MEASURING FOUR-DIMENSIONAL (4D) RADIATION PATTERN OF OUTDOOR ANTENNA BASED ON UNMANNED AERIAL VEHICLE (UAV)

(71) Applicant: Nanjing University of Aeronautics and Astronautics, Nanjing (CN)

(72) Inventors: Qihui Wu, Nanjing (CN); Qiuming Zhu, Nanjing (CN); Tianxu Lan, Nanjing (CN); Yang Huang, Nanjing (CN); Jie Li, Nanjing (CN); Xiaofu Du, Nanjing (CN); Weizhi Zhong, Nanjing (CN); Lu Han, Nanjing (CN); Yunpeng Bai, Nanjing (CN); Junjie Zhang, Nanjing (CN); Kai Mao, Nanjing (CN)

(73) Assignee: Nanjing University of Aeronautics and Astronautics, Nanjing (CN)

( * ) Notice: Subject to any disclaimer, the term of this patent is extended or adjusted under 35 U.S.C. 154(b) by 0 days.

(21) Appl. No.: 18/025,681

(22) PCT Filed: May 6, 2021

(86) PCT No.: PCT/CN2021/091937
§ 371 (c)(1),
(2) Date: Mar. 10, 2023

(87) PCT Pub. No.: WO2021/175343
PCT Pub. Date: Sep. 10, 2021

(65) Prior Publication Data
US 2023/0274652 A1  Aug. 31, 2023

(51) Int. Cl.
G08G 5/00 (2006.01)
G05D 1/10 (2006.01)
G05D 1/00 (2006.01)

(52) U.S. Cl.
CPC ........... G08G 5/003 (2013.01); G05D 1/0022 (2013.01); G05D 1/101 (2013.01)

(58) Field of Classification Search
CPC ....... G08G 5/003; G05D 1/0022; G05D 1/101
See application file for complete search history.

(56) References Cited

FOREIGN PATENT DOCUMENTS

| CN | 105319449 A | | 2/2016 | |
|---|---|---|---|---|
| CN | 107085150 A | * | 8/2017 | ............ G01R 29/10 |
| CN | 107085150 A | | 8/2017 | |

(Continued)

OTHER PUBLICATIONS

English translation for reference CN107085150 (Year: 2017).*
English translation for reference CN107607797 (Year: 2018).*

*Primary Examiner* — Rachid Bendidi
(74) *Attorney, Agent, or Firm* — Bayramoglu Law Offices LLC

(57) ABSTRACT

A method and a device for measuring a four-dimensional (4D) radiation pattern of an outdoor antenna based on an unmanned aerial vehicle (UAV) are provided. The device includes a measurement path planning unit, a UAV platform unit, a radiation signal acquisition unit, a data command processing unit, and a ground data processing unit. The measurement path planning unit, the radiation signal acquisition unit, and the data command processing unit each are suspended from the UAV platform unit by using a pod. The present disclosure applies to the radiation pattern measurement of an outdoor antenna.

13 Claims, 2 Drawing Sheets

(56) References Cited

FOREIGN PATENT DOCUMENTS

| | | | |
|---|---|---|---|
| CN | 107179449 A | | 9/2017 |
| CN | 107607797 A | * | 1/2018 |
| CN | 107607797 A | | 1/2018 |
| CN | 107632208 A | | 1/2018 |
| CN | 109298251 A | | 2/2019 |
| DE | 102011015917 A1 | | 10/2012 |
| RU | 2704393 C1 | | 10/2019 |
| WO | WO-2012130894 A1 * | 10/2012 | ............. G01R 29/10 |

* cited by examiner

METHOD AND DEVICE FOR MEASURING FOUR-DIMENSIONAL (4D) RADIATION PATTERN OF OUTDOOR ANTENNA BASED ON UNMANNED AERIAL VEHICLE (UAV)

CROSS REFERENCE TO THE RELATED APPLICATIONS

This application is the national phase entry of International Application No. PCT/CN2021/091937, filed on May 6, 2021, the entire contents of which are incorporated herein by reference.

TECHNICAL FIELD

The present disclosure relates to the technical field of antenna, particularly to a method and device for measuring a four-dimensional (4D) radiation pattern of an outdoor antenna based on an unmanned aerial vehicle (UAV).

BACKGROUND

An antenna is essential to a device such as broadcast, television, communication, and radar. The accuracy of a measurement result for an antenna radiation pattern affects the validation of an antenna performance metric and the performance evaluation of the entire system.

The radiation field of an antenna is divided into a near-field region and a far-field region based on the radius $r=2D^2/\lambda$ of the first Fresnel zone. D indicates the antenna diameter, which is measured in meters (m). $\lambda$ represents the wavelength of the antenna when it operates at the highest frequency, which is measured in meters (m). The antenna radiation pattern can be measured through near-field measurement and far-field measurement. Usually, a microwave anechoic chamber is used in the far-field measurement of a small-diameter antenna and the near-field measurement.

The far-field measurement of a large-diameter antenna requires a larger space and cannot be performed in a microwave anechoic chamber. Currently, the far-field measurement of an outdoor antenna can be performed on an elevated antenna test site or inclined antenna test site or by using a UAV. The elevated antenna test site and inclined antenna test site require a tall building or an insulated tower. This causes high construction costs. In addition, the outdoor antenna needs to be transported and mounted to the tall building or the insulated tower, which is time-consuming and laborious. Specifically, the actual usage environment of an antenna greatly affects the radiation pattern. Therefore, a measurement result obtained from a test site may differ from that obtained when the antenna is in actual operation, which affects the performance evaluation of the entire system. A UAV can be used to measure a radiation pattern of an outdoor antenna without the need to move the antenna. However, in the prior art, a UAV is used only to measure a three-dimensional (3D) radiation pattern of an outdoor antenna. The measurement efficiency is low, and system errors cannot be fully eliminated.

SUMMARY

The present disclosure provides a method and device for measuring a 4D radiation pattern of an outdoor antenna based on a UAV to improve efficiency and accuracy in radiation pattern measurement for the outdoor antenna in the prior art. In this way, a 4D radiation pattern in consideration of spatial and frequency factors can be measured. In addition, background interference cancellation technology is used, which effectively improves measurement accuracy.

To achieve the foregoing objective, an example of the present disclosure provides a method for measuring a 4D radiation pattern of an outdoor antenna based on a UAV. The method includes:

calculating an optimal flight path for measurement for the UAV based on user input information of an antenna to be tested;

flying the UAV along the optimal flight path for measurement based on an on-off state of the antenna to be tested and an on-off state of a benchmark antenna; and collecting, by the UAV, multiple groups of data and sending the multiple groups of data to a ground data processing unit, where a directional antenna of the UAV points to an antenna phase center in a flying process of the UAV, and one of the multiple groups of data includes signal data and corresponding global positioning system (GPS) location data that are collected during a flight of the UAV;

converting, by the ground data processing unit, the GPS location data to a sampling location in a spherical coordinate system relative to the antenna phase center, and processing, by the ground data processing unit, the signal data to obtain raw data of the antenna to be tested and benchmark data of the benchmark antenna, where the raw data and the benchmark data each include a received signal intensity corresponding to a frequency at each sampling location;

correcting, by the ground data processing unit, the raw data and the benchmark data, and calibrating corrected raw data based on corrected benchmark data to obtain discrete pattern data; and interpolating, by the ground data processing unit, the discrete pattern data to obtain spatial frequency 4D pattern data for the antenna to be tested.

Specifically, the calculating an optimal flight path for measurement for the UAV based on user input information of an antenna to be tested includes:

calculating, by a measurement path planning unit, the optimal flight path for measurement for the UAV based on the user input information by using a Riemannian manifold, and generating, by the measurement path planning unit, an attitude command and GPS path data for the UAV Specifically, in the flying process of the UAV, generating, by a data command processing unit, a speed command based on the GPS path data and a received signal intensity in signal data that is currently collected; and regulating, by a UAV platform unit, the flying speed of the UAV based on the speed command, and pointing, by the UAV platform unit, the directional antenna of the UAV to the antenna phase center based on the attitude command and a pan-tilt-zoom (PTZ) direction.

Specifically, the flying the UAV along the optimal flight path for measurement based on an on-off state of the antenna to be tested and an on-off state of a benchmark antenna includes:

turning on the antenna to be tested; sending, by the antenna to be tested, a linear swept-frequency signal within a measurement frequency band; and flying the UAV for the first time along the optimal flight path for measurement, where signal data collected in the flight for the first time is measurement data of the antenna to be tested;

turning off the antenna to be tested, and flying the UAV for a second time along the optimal flight path for measurement, where signal data collected in the flight for the second time is background interference measurement data; and erecting the benchmark antenna nearby the antenna to be tested; turning on the benchmark antenna; sending, by the benchmark antenna, a linear swept-frequency signal within the measurement frequency band; and flying the UAV for a third time along the optimal flight path for measurement, where signal data collected in the flight for the third time is measurement data of the benchmark antenna.

Specifically, the converting, by the ground data processing unit, the GPS location data to a sampling location in a spherical coordinate system relative to the antenna phase center includes:

converting GPS coordinates in the GPS location data to geocentric Cartesian coordinates;

converting the geocentric Cartesian coordinates to local Cartesian coordinates that use the antenna phase center as an origin; and converting the local Cartesian coordinates to spherical coordinates that use the antenna phase center as an origin, where the spherical coordinates are used as the sampling location.

Specifically, the method includes: processing, by the ground data processing unit, the signal data to obtain raw data corresponding to the measurement data of the antenna to be tested, benchmark data corresponding to the measurement data of the benchmark antenna, and interference data corresponding to the background interference measurement data.

Specifically, the correcting, by the ground data processing unit, the raw data and the benchmark data includes:

eliminating interference data from the raw data and the benchmark data by using the following formulas:

$$\overline{R_t(\zeta,i)} = 10 \lg\left(10^{\frac{R_t'(\zeta,i)}{10}} - 10^{\frac{\sigma(\zeta,i)}{10}}\right)$$

$$\overline{R_b(\zeta,i)} = 10 \lg\left(10^{\frac{R_b'(\zeta,i)}{10}} - 10^{\frac{\sigma(\zeta,i)}{10}}\right)$$

where $R_t'(\zeta, i), \sigma(\zeta,i), R_b'(\zeta,i)$ represent three received signal intensities that are obtained at a frequency of $\zeta$ at an $i^{th}$ sampling location. The three received signal intensities are measured in dBm and represent the raw data $R_t'(\zeta,i)$, the interference data $\sigma(\zeta,i)$, and the benchmark data $R_b'(\zeta,i)$, respectively. $\overline{R_t(\zeta,i)}, \overline{R_b(\zeta,i)}$ represent two received signal intensities that are obtained at the frequency of $\zeta$ at the $i^{th}$ sampling location and from which background interference is eliminated, where the two received signal intensities are measured in dBm and represent raw data from which background interference is eliminated and benchmark data from which background interference is eliminated, respectively.

Specifically, the correcting, by the ground data processing unit, the raw data and the benchmark data further includes:

normalizing the raw data from which the background interference is eliminated and the benchmark data from which the background interference is eliminated by using the following formulas:

$$\overline{\overline{R_t(\zeta,i)}} = \overline{R_t(\zeta,i)}_{\max}\left\{\overline{R_t(\zeta,1)},...,\overline{R_t(\zeta,m)}\right\}$$

$$\overline{\overline{R_b(\zeta,i)}} = \overline{R_b(\zeta,i)}_{\max}\left\{\overline{R_b(\zeta,1)},...,\overline{R_b(\zeta,m)}\right\}$$

where m is a positive integer that indicates the total number of sampling locations, $\overline{\overline{R_t(\zeta,i)}}, \overline{\overline{R_b(\zeta,i)}}$ represent two normalized signal intensities obtained at the frequency of $\zeta$ at the $i^{th}$ sampling location, where the two normalized signal intensities represent normalized raw data from which the background interference is eliminated and normalized benchmark data from which the background interference is eliminated, respectively.

Specifically, the calibrating corrected raw data based on corrected benchmark data to obtain discrete pattern data includes:

calibrating, by using the following formula, the normalized raw data from which the background interference is eliminated based on the normalized benchmark data from which the background interference is eliminated, to obtain the discrete pattern data:

$$R_f(\zeta,i) = \overline{\overline{R_t(\zeta,i)}} - \overline{\overline{R_b(\zeta,i)}} + \overline{R_s(\zeta,i)}$$

where $\overline{R_s(\zeta,i)}$ represents a normalized signal intensity corresponding to a standard pattern of the benchmark antenna at the frequency of $\zeta$ at the $i^{th}$ sampling location, $R_f(\zeta,i)$ represents a normalized signal intensity corresponding to a spatial frequency discrete pattern of the antenna to be tested at the frequency of $\zeta$ at the $i^{th}$ sampling location, and $R_f(\zeta,i)$ represents the discrete pattern data.

Specifically, the discrete pattern data is interpolated by a deep neural network, where the deep neural network is indicated by A (n$\kappa$; $\theta_a$) that is obtained after multiple times of iterative training performed on two deep neural networks A (n|c; $\theta_a$) and B (d|c; $\theta_b$), where n represents a random variable subject to a standard Gaussian distribution $p_n(n)$, c represents the spatial frequency discrete pattern data that is used for training and subject to a distribution of $p_{data}$ (c) d represents the output of the deep neural network A (n$\kappa$; $\theta_a$) or continuous pattern data that is used for training and subject to a distribution of $p_{data}$ (d) and $\theta_a$ and $\theta_b$ are node parameters in the iteration.

An example of the present disclosure further provides a device for measuring a 4D radiation pattern of an outdoor antenna based on a UAV. The device includes:

a measurement path planning unit, configured to calculate a flight path for the UAV based on user input information of an antenna to be tested;

a UAV platform unit, configured to control the flight of the UAV based on the flight path and collect GPS location data;

a radiation signal acquisition unit, configured to receive a signal sent by each of the antenna to be tested and a benchmark antenna in each on-off state;

a data command processing unit, configured to regulate the flight of the UAV based on a received signal to enable a directional antenna of the UAV to point to an antenna phase center and collect signal data; and a ground data processing unit, configured to convert the GPS location data to a sampling location in a spherical coordinate system, process the collected signal data to obtain raw data of the antenna to be tested and benchmark data of the benchmark antenna, and obtain spatial frequency 4D pattern data based on the raw data and the benchmark data, where the measurement path planning unit, the radiation signal acquisition unit, and the data command processing unit each are suspended from the UAV platform unit by using a pod.

Specifically, the measurement path planning unit includes a user input module, a path calculation module, and a control command module, where the user input module is configured to obtain user input information;

the path calculation module is configured to calculate an optimal flight path for measurement and an attitude at each moment for the UAV based on the user input information; and the control command module is configured to generate an attitude command based on the optimal flight path for measurement and the attitude.

Specifically, the UAV platform unit includes a GPS module, a flight control module, and a PTZ control module;

the data command processing unit includes a speed regulation module and a data transmission module, where the data transmission module is configured to encapsulate real-time GPS location data collected by the GPS module and demodulated data of a signal received by the radiation signal acquisition unit into a data frame, and send the data frame to the ground data processing unit over a radio link;

the PTZ control module is configured to receive the attitude command, and the speed regulation module is configured to receive the optimal flight path for measurement;

the flight control module is configured to receive a speed command that is generated by the speed regulation module based on a signal intensity sent by the radiation signal acquisition unit;

the flight control module is configured to control the flying speed and direction of the UAV based on a speed command received in real time; and the PTZ control module is configured to control the attitude or the direction of the directional antenna on the UAV in real time based on GPS location data sent by the GPS module 1-9 and the attitude command; and the radiation signal acquisition unit includes the directional antenna and a broadband signal receiver that is configured to demodulate a signal received by the directional antenna.

Specifically, the ground data processing unit includes a data receiving module, a data processing module, a data correction module, and a pattern generation module, where the data processing module is configured to receive, by using the data receiving module, a signal that is sent by the data transmission module and that includes signal data and GPS location data;

the data processing module is configured to demodulate a signal sent by the data transmission module, perform coordinate conversion on demodulated data, and send converted data to the data correction module;

the data correction module is configured to eliminate background interference, calibrate data, and send calibrated data to the pattern generation module; and the pattern generation module is configured to calculate E-plane and H-plane pattern data for the antenna to be tested and reconstruct spatial frequency 4D pattern data based on the E-plane and H-plane pattern data.

The present disclosure can be used to efficiently and accurately measure a spatial frequency (that is, of a space and a frequency) 4D pattern for an outdoor antenna, especially an outdoor antenna with a large diameter. In the present disclosure, methods such as measurement based on radiated swept-frequency signals and interpolation of measured data at discrete locations are used, which greatly enhances measurement efficiency. In addition, methods such as background interference cancellation and benchmark antenna calibration are used, which greatly improves measurement accuracy.

Other features and advantages of examples of the present disclosure are described in detail in the subsequent specific implementation part.

BRIEF DESCRIPTION OF THE DRAWINGS

The accompanying drawings are provided for enabling further understanding of the examples of the present disclosure and constitute a part of the specification. The accompanying drawings and the following specific implementations are intended to explain examples of the present disclosure, rather than to limit the examples of the present disclosure. In the accompanying drawings.

DETAILED DESCRIPTION OF THE EMBODIMENTS

Specific implementations of the examples of the present disclosure are described in detail below by referring to the accompanying drawings. It should be understood that the implementations described herein are merely intended to illustrate and interpret the examples of the present disclosure and do not limit the examples of the present disclosure.

Example 1

Figure 1:
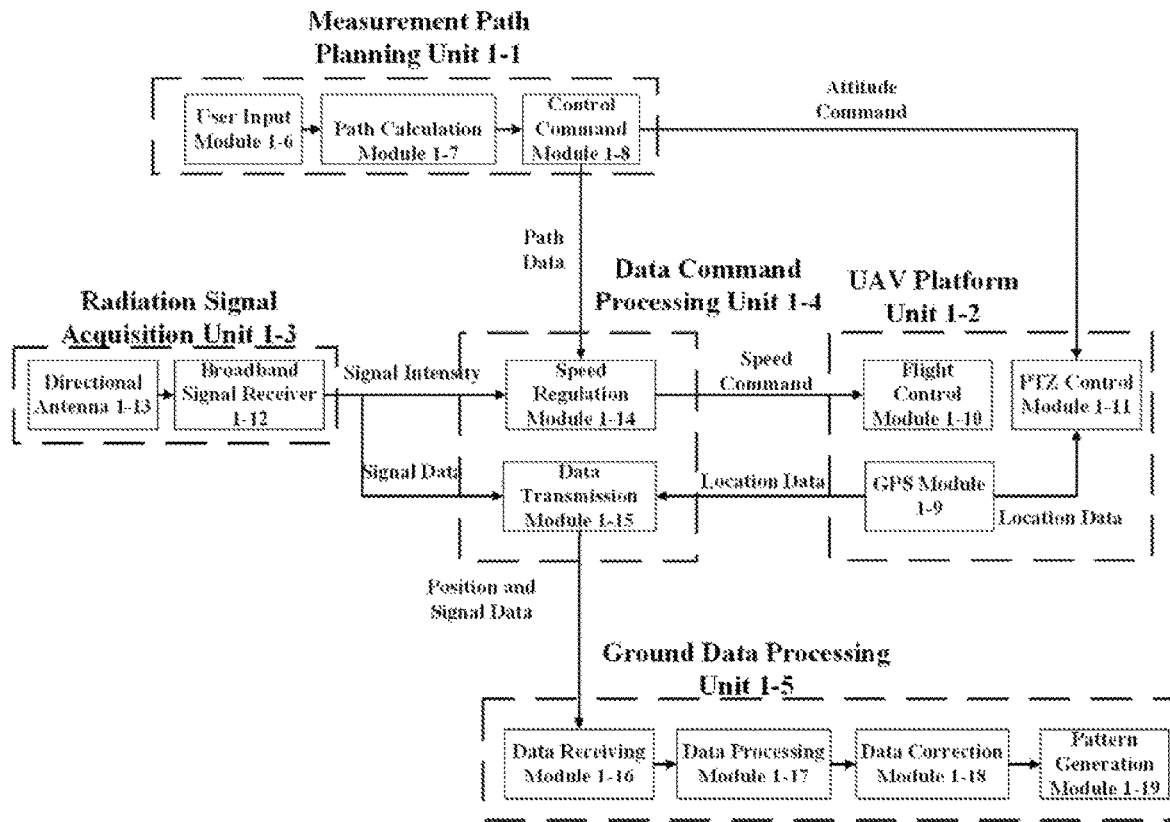
FIG. 1 is a schematic structural diagram of a device for measuring a radiation pattern of an antenna according to an example of the present disclosure.

An example of the present disclosure provides a device for measuring a 4D radiation pattern of an outdoor antenna based on a UAV, as shown in FIG. 1. The device may include measurement path planning unit 1-1, UAV platform unit 1-2, radiation signal acquisition unit 1-3, data command processing unit 1-4, and ground data processing unit 1-5. The measurement path planning unit 1-1, radiation signal acquisition unit 1-3, and data command processing unit 1-4 each are suspended from the UAV platform 1-2 unit by using a pod. The UAV may include a housing and the UAV platform unit 1-2 that resides in the housing. The housing may include the pod.

In some examples, the measurement path planning unit 1-1 may include user input module 1-6, path calculation module 1-7, and control command module 1-8. A user can use the user input module 1-6 to enter user input information such as a location, diameter, type, and frequency band for measuring a radiation pattern for an antenna to be tested. The path calculation module 1-7 calculates an optimal flight path for measurement and an attitude at each moment based on the user input information. The control command module 1-8 generates an attitude command based on the optimal flight path for measurement and a corresponding attitude and sends the attitude command to PTZ control module 1-11 and flight path data to speed regulation module 1-14.

The UAV platform unit 1-2 may include GPS module 1-9, flight control module 1-10, and the PTZ control module 1-11. The GPS module 1-9 is connected to data transmission module 1-15. The GPS module 1-9 collects location data of the UAV in real time and sends the location data to a ground data processing unit through the data transmission module 1-15. The flight control module 1-10 receives a speed command from the speed regulation module 1-14 in real time and controls the flying speed and direction of the UAV based on the speed command. The PTZ control module 1-11 controls the attitude or direction of an antenna disposed on the UAV in real time based on the location data sent by the GPS module 1-9 and the attitude command.

The radiation signal acquisition unit 1-3 may include broadband signal receiver 1-12 and directional antenna 1-13. The directional antenna 1-13 collects signals radiated by the antenna to be tested on the ground from different locations and directions. The broadband signal receiver 1-12 demodulates a received signal, extracts information such as signal intensity, and sends the information to the speed regulation module 1-14.

The data command processing unit 1-4 may include the speed regulation module 1-14 and the data transmission module 1-15. The data transmission module 1-15 encapsulates real-time location information received by the GPS module 1-9 and signal information collected by the radiation signal acquisition unit 1-3 into a data frame and sends the data frame to data receiving module 1-16 over a radio link. The speed regulation module 1-14 generates a speed command based on path data sent by the control command module 1-8 and a signal intensity sent by the radiation signal acquisition unit 1-3 and sends the speed command to the flight control module.

The ground data processing unit 1-5 includes data processing module 1-17, data correction module 1-18, pattern generation module 1-19, and the data receiving module 1-16. The data receiving module 1-16 is connected to the data processing module 1-17. The data receiving module 1-16 receives signal and location measurement data (i.e., signal data and GPS location data) that is sent by the data transmission module 1-15 and sends the signal and location measurement data to the data processing module 1-17. The data processing module 1-17 processes (for example, demodulates and decapsulates) received data, performs coordinate conversion on processed data, and sends data that is obtained after coordinate conversion to the data correction module 1-18. The data correction module 1-18 performs electromagnetic-environment background interference cancellation and signal data calibration on received data, and sends the data to the pattern generation module 1-19. The pattern generation module 1-19 calculates E-plane and H-plane pattern data for the antenna to be tested and reconstructs spatial frequency 4D pattern data based on the E-plane and H-plane pattern data. It should be noted that in some cases, the foregoing module or unit may be implemented in a digital electronic circuit system, an integrated circuit system, a field-programmable gate array (FPGA), an application-specific integrated circuit (ASIC), an application-specific standard product (ASSP), a system on a chip (SoC), a complex programmable logic device (CPLD), computer hardware, firmware, software, and/or combinations thereof.

An example of the present disclosure provides a method for measuring a 4D radiation pattern of an outdoor antenna based on a UAV. The method includes the following steps:

An optimal flight path for measurement for the UAV is calculated based on user input information of an antenna to be tested.

The UAV is made to fly along the optimal flight path for measurement based on an on-off state of the antenna to be tested and an on-off state of a benchmark antenna, and multiple groups of data are collected and sent to a ground data processing unit by the UAV. During the flying process, a directional antenna of the UAV points to an antenna phase center. One of the multiple groups of data includes signal data and corresponding GPS location data that are collected during the flight of the UAV.

The GPS location data is converted to a sampling location in a spherical coordinate system relative to the antenna phase center by the ground data processing unit, and the signal data is processed by the ground data processing unit to obtain raw data of the antenna to be tested and benchmark data of the benchmark antenna. The raw data and the benchmark data each include a received signal intensity corresponding to a frequency at each sampling location.

The raw data and the benchmark data are corrected by the ground data processing unit, and corrected raw data is calibrated based on corrected benchmark data to obtain discrete pattern data.

The discrete pattern data is interpolated by the ground data processing unit to obtain spatial frequency 4D pattern data for the antenna to be tested.

Figure 2:
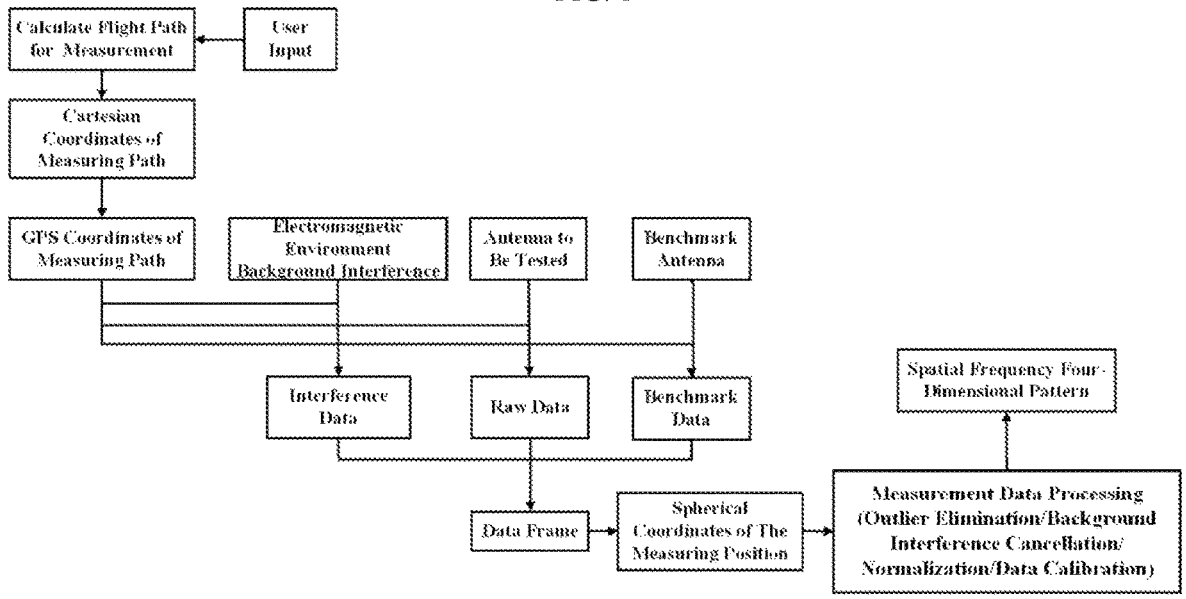
FIG. 2 is a flowchart of a method for measuring a radiation pattern of an antenna according to an example of the present disclosure.
Figure 3:
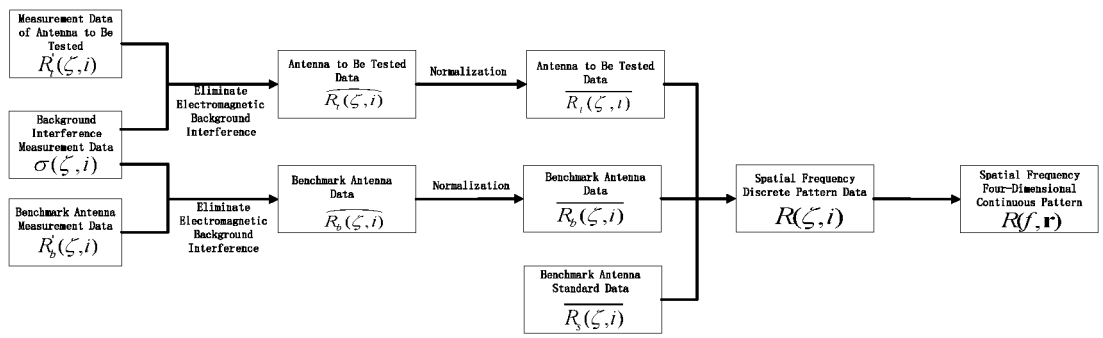
FIG. 3 is a brief flowchart for processing measurement data according to an example of the present disclosure.

In some specific implementations, referring to FIG. 2 and FIG. 3, the method includes the following steps: Step 1: Information, such as a location, diameter, type, and frequency band for measuring a radiation pattern for the antenna to be tested, is entered by a user. Based on the information, an optimal flight path for measurement is calculated for the UAV by measurement path planning unit 1-1, and an attitude command corresponding to each moment and GPS path data (that is, data about the optimal flight path for measurement) are generated. A speed command is generated by speed regulation module 1-14 based on signal intensity data that is currently collected and the path data. A flying speed is regulated by a UAV platform unit based on the speed command, and directional antenna 1-13 is enabled to point to the antenna phase center based on the attitude command and a PTZ direction. The antenna phase center is an area in which an antenna radiates a signal.

Specifically, the flight path for measurement is calculated based on the following steps:

1. The following formula is used to calculate a radius of a hemispherical surface that takes the antenna phase center as the origin and on which a flight path of the UAV resides:

$$r=2D^2/\lambda, \lambda=c/f_{max} \tag{1}$$

D indicates an antenna diameter (unit: m). $f_{max}$ indicates the highest frequency in a pattern measurement frequency band (unit: Hz). c indicates a light speed.

2. A spherical coordinate system that takes the antenna phase center as the origin is established. The hemispherical surface is defined by a Riemannian manifold. In other words, a movement path on the hemispherical surface is determined by a geodesic distance of a hemispherical mani fold M. In this case, a parameter space of the hemispherical manifold M can be expressed as:

$$M = \{(\theta, \varphi) : -\pi < \theta < \pi,\ 0 \le \varphi < \frac{\pi}{2}\} \quad (2)$$

θ indicates a pitch angle relative to the origin, and φ indicates an azimuth relative to the origin. Expression (2) shows that the hemispherical surface M is an embedded submanifold in a 3D Euclidean space $\mathbb{R}^3$. In other words, $\mathcal{M} \subset \mathbb{R}^3$. Therefore, a Euclidean inner product can be used to define a Riemannian metric of the hemispherical manifold M, as shown in the following formula:

$$\langle \xi, \eta \rangle_u := \xi^T \eta \quad (3)$$

ξ∈M and η∈M indicate tangent vectors of a point u on the manifold.

The hemispherical surface M is divided into N×N (N is a positive integer) equal-area grids based on (θ,φ) and the foregoing geodesic distance. The coordinates of each grid center represent a node u of a tree diagram. All nodes constitute a set V, which is a subset of the foregoing hemispherical manifold. In other words, V⊂M. A node adjacent to the node u is a child node of the node u. A root node $u_1(\theta_1, \varphi_1)=(0,0)$. All parent nodes of a node $u_k$ in an order of K constitute a set W. A length s between the node $u_k$ and its child node is calculated by using the following formula:

$$s = \sum_{k=1}^{N^2-K} \|p_k\|_2 \quad (4)$$

$p_k$ indicates a directed path between this child node and a node u∈V∩u∉W that is not a parent node of the node $u_k$.

A path from the root node to a node in an order of $0.5N^2$ is the shortest is selected. Directed paths between nodes constitute a set of flight paths. To enhance search efficiency, the search path should meet the requirement that each node appears only once in the path. As a result, a flight path G(r, θ, φ) of the UAV can be obtained.

3. A GPS location of the antenna to be tested is specified as $(B_0, L_0, H_0)$. $B_0, L_0, H_0$ indicate the latitude, longitude, and height of the antenna to be tested, respectively. Geodetic coordinates of the flight path relative to the antenna can be calculated by using the following formulas:

$$\begin{cases} \Delta B = \dfrac{Y}{111133.56} \\ \Delta L = \dfrac{X}{111321.4\cos\left(\dfrac{B_0 \pi}{180}\right)} \\ \Delta H = Z + H_0 \end{cases} \quad (5)$$

$$\begin{cases} X = r\sin\theta\sin\varphi \\ Y = r\sin\theta\cos\varphi \\ Z = r\cos\theta \end{cases} \quad (6)$$

GPS coordinates (B,L,H) of any location on the flight path for measurement can be obtained by adding $(B_0, L_0, H_0)$ to (ΔB, ΔL, ΔH).

Step 2: Three flights of the UAV are carried out based on the planned flight path and data is collected. This corresponds to three on-off states (to be specific, states in which any of the foregoing antenna is turned on and/or turned off) of transmitting antennas on the ground. Specifically, a linear swept-frequency signal is transmitted by the antenna to be tested, electromagnetic environment background interference is measured when the antenna to be tested is turned off, and a linear swept-frequency signal is transmitted by the benchmark antenna. Three groups of discrete data collected are sent to data receiving module 1-16 on the ground. To be specific, this process includes the following steps:

1. The antenna to be tested is turned on to transmit a linear swept-frequency signal within the measurement frequency band, and the UAV is made to fly along the planned flight path. A flying speed is determined based on path data and a change rate in a signal intensity collected in real time. A flying attitude is determined based on real-time location data and a preset attitude command. Data collected in this test is recorded as measurement data $R_t'(\zeta,i)$ for the antenna to be tested, which is sent to the data receiving module 1-16 by data transmission module 1-15.

2. The antenna to be tested is turned off, the UAV is made to fly along the planned flight path, and electromagnetic-environment background interference data is collected without any signal transmitted from an antenna. Flying speeds at different moments in this test are the same as those in the foregoing test. Data collected in this test is recorded as background interference measurement data σ(ζ,i), which is sent to the data receiving module 1-16 by the data transmission module 1-15.

3. The benchmark antenna is erected nearby (the term "nearby" indicates a distance within a proper range in relation to the size of the antenna to be tested, such as 1 m, 2 m, or 10 m) the antenna to be tested and turned on to transmit a linear swept-frequency signal within the measurement frequency band, and the UAV is made to fly along the planned flight path. Flying speeds at different moments in this test are the same as those in the foregoing test. Data collected in this test is recorded as measurement data $R_b'(\zeta,i)$ for the benchmark antenna, which is sent to the data receiving module 1-16 by the data transmission module 1-15.

Step 3: The three groups of data are sent to data processing module 1-17 by the data receiving module 1-16. Received data is demodulated by the data processing module 1-17, GPS coordinates in location data are converted to spherical coordinates relative to the antenna phase center, and the spherical coordinates are sent to data correction module 1-18.

Specifically, the GPS coordinates can be converted based on the following steps:

1. The GPS coordinates in the location data are converted to geocentric Cartesian coordinates by using the following formula:

$$\begin{cases} X = (N + H)\cos B \cos L \\ Y = (N + H)\cos B \sin L \\ Z = [N(1 - e^2) + H]\sin B \end{cases} \quad (7)$$

$N = a/\sqrt{1 - e^2 \sin B}$ and $$e^2 = \frac{a^2 - b^2}{a^2},$$

where a=63/813 1=6356752m. B, L, and H indicate latitude, longitude, and height, respectively.

2. The geocentric Cartesian coordinates are converted to local Cartesian coordinates that use the antenna phase center as the origin based on the following formula:

$$\begin{bmatrix} X_p \\ Y_p \\ Z_p \end{bmatrix} = \begin{bmatrix} -\sin B & \cos L & 0 \\ -\sin B \cos L & -\sin B \sin L & \cos B \\ \cos B \cos L & \cos B \sin L & \sin B \end{bmatrix} \times \left( \begin{bmatrix} X \\ Y \\ Z \end{bmatrix} - \begin{bmatrix} X_o \\ Y_o \\ Z_o \end{bmatrix} \right) \quad (8)$$

(X,Y,Z) indicates the geocentric Cartesian coordinates, ($X_0$, $Y_0$, $Z_0$) indicates geocentric Cartesian coordinates of the origin, and (B,L,H) indicates geocentric geodetic coordinates.

3. The local Cartesian coordinates are converted to spherical coordinates that use the antenna phase center as the origin based on the following formula:

$$r = \sqrt{X_p^2 + y_p^2 + Z_p^2}, \theta = \arcsin\frac{Z_p}{r}, \phi = \arctan\frac{y_p}{X_p} \quad (9)$$

r indicates a distance between a point ($X_p$, $Y_p$, $Z_p$) in a local Cartesian coordinate system and the origin. $\theta$ indicates a pitch angle relative to the origin, and $\varphi$ indicates an azimuth relative to the origin.

Step 4: Outlier elimination, electromagnetic environment background interference (namely, background interference) cancellation (or elimination), and data calibration are performed on data by the data correction module 1-18, and calibrated data is sent to pattern generation module 1-19. To be specific, this process includes the following steps:

1. Obvious outliers are eliminated from raw data and benchmark data, and electromagnetic-environment background interference data at the same locations is eliminated. The following formulas are used:

$$\widetilde{R_t(\zeta,i)} = 10\lg\left(10^{\frac{R_t'(\zeta,i)}{10}} - 10^{\frac{\sigma(\zeta,i)}{10}}\right) \quad (10)$$

$$\widetilde{R_b(\zeta,i)} = 10\lg\left(10^{\frac{R_b'(\zeta,i)}{10}} - 10^{\frac{\sigma(\zeta,i)}{10}}\right) \quad (11)$$

$R_t'(\zeta,i)$, $\sigma(\zeta,i)$, $R_b'(\zeta,i)$ indicate received signal intensities (unit: dBm) that are obtained at a frequency of $\zeta$ at an $i^{th}$ sampling location. $R_t'(\zeta,i)$, $\sigma(\zeta,i)$, $R_b'(\zeta,i)$ represent the raw data $R_t'(\zeta, i)$, interference data $\sigma(\zeta,i)$, and benchmark data $R_b'(\zeta,i)$, respectively. $\widetilde{R_t(\zeta,i)}, \widetilde{R_b(\zeta,i)}$ indicate received signal intensities (unit: dBm) that are obtained at the frequency of $\zeta$ at the $i^{th}$ sampling location and from which electromagnetic environment background interference is eliminated. $\widetilde{R_t(\zeta,i)}, \widetilde{R_b(\zeta,i)}$ indicate raw data from which the background interference is eliminated and benchmark data from which the background interference is eliminated, respectively.

2. The two groups of data from which the electromagnetic environment background interference is eliminated are normalized by using the following formulas:

$$\overline{R_t(\zeta,i)} = \frac{\widetilde{R_t(\zeta,i)}_{\max}}{\left\{\widetilde{R_t(\zeta,1)},...,\widetilde{R_t(\zeta,m)}\right\}} \quad (12)$$

$$\overline{R_b(\zeta,i)} = \frac{\widetilde{R_b(\zeta,i)}_{\max}}{\left\{\widetilde{R_b(\zeta,1)},...,\widetilde{R_b(\zeta,m)}\right\}} \quad (13)$$

m is a positive integer that indicates the total number of sampling locations. $\overline{R_t(\zeta,i)}, \overline{R_b(\zeta,i)}$ represent normalized signal intensities obtained at the frequency of $\zeta$ at the $i^{th}$ sampling location. $\overline{R_t(\zeta,i)}, \overline{R_b(\zeta,i)}$ indicate normalized raw data from which the background interference is eliminated and normalized benchmark data from which the background interference is eliminated, respectively.

3. The normalized raw data from which the background interference is eliminated is calibrated based on the normalized benchmark data from which the background interference is eliminated. The following formula is used:

$$R_f(\zeta,i) = \overline{R_t(\zeta,i)} - \overline{R_b(\zeta,i)} + \overline{R_s(\zeta,i)} \quad (14)$$

$\overline{R_s(\zeta,i)}$ indicates a normalized signal intensity corresponding to a standard pattern of the benchmark antenna at the frequency of $\zeta$ at the $i^{th}$ sampling location. $R_f(\zeta,i)$ indicates spatial frequency (that is, of a space and a frequency) discrete pattern data.

Step 5: The spatial frequency discrete pattern data $R_f(\zeta,i)$ is interpolated by the pattern generation module 1-19 based on a neural network A (n|c; $\theta_a$) that is trained by a deep learning-based data generation algorithm to obtain spatial frequency 4D pattern data R(f,r) for the antenna to be tested.

Two deep neural networks A (n|c;$\theta_a$) and B (d|c; $\theta_b$) are trained by using 4D continuous pattern data and spatial frequency discrete pattern data of an antenna of the same type as the antenna to be tested. n indicates a random variable subject to a standard Gaussian distribution $p_n$ (n). c indicates the spatial frequency discrete pattern data (subject to distribution of $p_{data}$ (c)) that is used for training. d indicates the output of the network A (n|c; $\theta_a$) or the continuous pattern data (subject to distribution of $p_{data}$ (d)) that is used for training. $\theta_a$ and $\theta_b$ indicate parameters to be optimized by the two deep neural networks. To be specific, the two deep neural networks are trained to optimize $\theta_a$ and $\theta_b$, which can be expressed by using the following formula:

$$\min_{\theta_a} \max_{\theta_b} V(A, B) = E_{d \sim p_{data}(d)}[B(d \mid c; \theta_b)] - \quad (15)$$

$$E_{n \sim p_n(n)}[B(A(n \mid c; \theta_a) \mid c; \theta_b] + E_{c \sim p_{data}(c)}[W_c e c - W_c e F(A(n \mid c; \theta_a))_1]$$

V (A,B) indicates a cost function used for training the deep neural network. e indicates a Hadamard product. F (g) indicates a sampling function that performs sampling on the output of the network A(n|c;$\theta_a$) in the same way as that is used for sampling the spatial frequency discrete pattern data. An $i^{th}$ element of a weight $W_c$ can be expressed by using the following formula:

$$W_c(i) = \lambda_1 c(i) + \lambda_2 \frac{d_{i,i+1} + d_{i,i-1}}{2 \sum d_{i,j}} \quad (16)$$

$d_{i,j}$ indicates a distance between the $i^{th}$ sampling location and a $j^{th}$ sampling location. $\lambda_1$ and $\lambda_2$ indicate weights of the two sampling locations. Further, values of $\lambda_1$ and $\lambda_2$ are determined based on prior information such as a sampling location of the UAV and outdoor weather. In other words, the prior information determines specific models of the deep learning-based interpolation algorithm. After multiple times of iterative training of the networks A (nк; $\theta_a$) and B (d|c; $\theta_b$), the network A (nк; $\theta_a$) can be used to interpolate the spatial frequency discrete pattern data $R_r(\zeta,i)$ to obtain the 4D (continuous) pattern data R(f,r).

The example of the present disclosure has the following advantages:

1. An optimal flight path for measurement can be autonomously planned based on features, such as the location and type of an antenna. A real-time flying position can be reported to the ground data processing unit 1-5 for calibration. This greatly reduces impacts caused by flight path errors.

2. All radiation patterns within a specific frequency band can be obtained at a time by measuring a broadband swept-frequency signal transmitted by the antenna to be tested. For a conventional practice, only a radiation pattern for a single frequency can be obtained at a time.

3. A more accurate measurement result can be obtained by measuring the electromagnetic environment background interference and performing data calibration.

4. A temporal frequency 4D pattern instead of a conventional spatial 3D pattern is obtained based on a 4D pattern generation algorithm.

A specific implementation of the present disclosure provides an example of how to measure a radiation pattern within a frequency band of 40 MHz to 50 MHz for a half-wave symmetrical array antenna whose diameter is 6 m at a latitude of 31.93° and longitude of 118.79°. The antenna phase center is 5 m in height. It should be noted that this does not constitute a limitation on the implementation of the examples of the present disclosure. The following steps are included:

Step 1: Information, such as a location, diameter, type, and measurement frequency band for the antenna to be tested, is entered by a user. On the basis of the information, an optimal flight path for measurement is calculated for the UAV by the measurement path planning unit 1-1, and GPS path data and a corresponding attitude command are generated. A speed command is generated by the speed regulation module 1-14 based on signal intensity data that is currently collected and the path data. A flying speed is regulated by the UAV platform unit based on the speed command, and the directional antenna 1-13 is enabled to point to the antenna phase center based on the attitude command and a PTZ direction.

Specifically, the flight path for measurement is calculated in Step 1 based on the following steps:

1. The flight path for measurement for the UAV involves an E plane and an H plane. The two planes both take the antenna to be tested as the origin. Parameters are substituted into the formula (1), and a radius r of 12 m can be obtained.

2. Spherical coordinates G(r,θ, φ) of the flight path of the UAV can be obtained by using the formulas (2), (3), and (4).

3. GPS coordinates (B,L,H) of the flight path can be obtained by using the formulas (5) and (6) based on the GPS location (31.93, 118.79, 5) of the antenna to be tested.

Step 2: Three flights of the UAV are carried out based on the planned flight path, and data is collected. This corresponds to three on-off states of transmitting antennas on the ground. Specifically, a linear swept-frequency signal is transmitted by the antenna to be tested, electromagnetic environment background interference is measured when the antenna to be tested is turned off, and a linear swept-frequency signal is transmitted by the benchmark antenna. Three groups of collected data are sent to the data receiving module 1-16 on the ground. To be specific, this process includes the following steps:

1. The antenna to be tested is turned on to transmit a linear swept-frequency signal within the measurement frequency band, and the UAV is made to fly along the planned flight path. A flying speed is determined based on path data and a change rate in a signal intensity collected in real time. A flying attitude is determined based on real-time location data and a preset attitude command. Data collected in this test is recorded as measurement data $R_t'(\zeta,i)$ for the antenna to be tested, which is sent to the data receiving module 1-16 by data transmission module 1-15.

2. The antenna to be tested is turned off, the UAV is made to fly along the planned flight path, and electromagnetic-environment background interference data is collected without any signal transmitted from an antenna. Flying speeds at different moments in this test are the same as those in the foregoing test. Data collected in this test is recorded as background interference measurement data σ(ζ,i), which is sent to the data receiving module 1-16 by the data transmission module 1-15.

3. The benchmark antenna is erected nearby the antenna to be tested and turned on to transmit a linear swept-frequency signal within the measurement frequency band, and the UAV is made to fly along the planned flight path. Flying speeds at different moments in this test are the same as those in the foregoing test. Data collected in this test is recorded as measurement data $R_b'(\zeta,i)$ for the benchmark antenna, which is sent to the data receiving module 1-16 by the data transmission module 1-15.

Step 3: The three groups of data are sent to the data processing module 1-17 by the data receiving module 1-16. Received data is demodulated by the data processing module 1-17, GPS coordinates in location data are converted to spherical coordinates relative to the antenna phase center, and the spherical coordinates are sent to data correction module 1-18.

The GPS coordinates in the location data are converted to the spherical coordinates that use the antenna phase center as the origin by using the formulas (7), (8), and (9).

Step 4: Outlier elimination, electromagnetic environment background interference cancellation, and data calibration are performed on data by the data correction module 1-18, and calibrated data is sent to the pattern generation module 1-19. To be specific, this process includes the following steps:

1. Obvious outliers are eliminated from raw data and benchmark data, and electromagnetic-environment background interference data at the same locations is eliminated by using the formulas (10) and (11). For example, if $R_t'(\zeta,2)$=20 dBm, σ(ζ,2)=10 dBm, then $\overline{R_t(\zeta,2)}$ =19.54 dBm.

2. The two groups of data from which the electromagnetic environment background interference is eliminated are normalized by using the formulas (12) and (13).

For example, if max $\{\overline{R_t(\zeta,1)}, \ldots, \overline{R_t(\zeta,n)}\}$=30 dBm and $\overline{R_t(\zeta,3)}$=10 dBm, then $\overline{R_t(\zeta,3)}$ =−20 dBm.

3. The normalized raw data from which the background interference is eliminated is calibrated by using the formula (14) based on the normalized benchmark data from which the background interference is eliminated. For example, if $\overline{R_t(\zeta,3)}$ =−20 dBm, $\overline{R_b(\zeta,3)}$ =−18 dBm, and $\overline{R_s(\zeta,i)}$ =−19 dBm, then $R_r(\zeta,i)$=−21 dBm.

Step 5: The final spatial frequency discrete pattern data is interpolated by the pattern generation module 1-19 based on a neural network $A(n|c; \theta_a)$ that is trained by a deep learning-based data generation algorithm to obtain spatial frequency 4D pattern data $R(f,r)$ for the antenna to be tested.

The foregoing describes optional implementations of the examples of the present disclosure in detail with reference to the accompanying drawings. However, the examples of the present disclosure are not limited to the specific details in the foregoing implementations. Within the scope of the technical concept of the examples of the present disclosure, various simple variations can be made to the technical solutions in the examples of the present disclosure. These simple variations all fall within the protection scope of the examples of the present disclosure.

In addition, it should be noted that various specific technical features described in the foregoing examples can be combined in any suitable manner, provided that there is no contradiction. To avoid unnecessary repetition, various possible combinations are not separately described in the examples of the present disclosure.

A person skilled in the art can understand that all or some of the steps for implementing the method in the foregoing examples can be completed by a program instructing relevant hardware. The program is stored in a storage medium and includes a plurality of instructions to enable a single-chip microcomputer, a chip, or a processor to perform all or some of the steps in the method described in each example of the present disclosure. The foregoing storage medium may be non-transient and include any medium that can store a program code, such as a universal serial bus (USB) flash disk, a hard disk, a read-only memory (ROM), a flash memory, a magnetic disk, or an optical disk.

In addition, various different examples of the present disclosure can also be arbitrarily combined, provided that the combinations do not violate the idea of the examples of the present disclosure. The combinations should also be regarded as the content disclosed in the examples of the present disclosure.

What is claimed is:

1. A method for measuring a four-dimensional (4D) radiation pattern of an outdoor antenna based on an unmanned aerial vehicle (UAV), comprising:
   calculating an optimal flight path for measurement for the UAV based on user input information of an antenna to be tested;
   flying the UAV along the optimal flight path for measurement based on an on-off state of the antenna to be tested and an on-off state of a benchmark antenna, collecting, by the UAV, a plurality of groups of data, and sending, by the UAV, the plurality of groups of data to a ground data processing unit, wherein a directional antenna of the UAV points to an antenna phase center in a flying process of the UAV, and one of the plurality of groups of data comprises signal data and corresponding global positioning system (GPS) location data collected during a flight of the UAV;
   converting, by the ground data processing unit, the corresponding GPS location data to a sampling location in a spherical coordinate system relative to the antenna phase center, and processing, by the ground data processing unit, the signal data to obtain raw data of the antenna to be tested and benchmark data of the benchmark antenna, wherein the raw data and the benchmark data each comprise a received signal intensity corresponding to a frequency at each sampling location;
   correcting, by the ground data processing unit, the raw data and the benchmark data, and calibrating corrected raw data based on corrected benchmark data to obtain discrete pattern data; and
   interpolating, by the ground data processing unit, the discrete pattern data to obtain spatial frequency 4D pattern data for the antenna to be tested;
   wherein the flying the UAV along the optimal flight path for measurement based on the on-off state of the antenna to be tested and the on-off state of the benchmark antenna comprises:
   turning on the antenna to be tested; sending, by the antenna to be tested, a first linear swept-frequency signal within a measurement frequency band; and flying the UAV for a first time along the optimal flight path for measurement, wherein signal data collected in a flight for the first time is measurement data of the antenna to be tested;
   turning off the antenna to be tested, and flying the UAV for a second time along the optimal flight path for measurement, wherein signal data collected in a flight for the second time is background interference measurement data; and
   erecting the benchmark antenna nearby the antenna to be tested; turning on the benchmark antenna; sending, by the benchmark antenna, a second linear swept-frequency signal within the measurement frequency band; and flying the UAV for a third time along the optimal flight path for measurement, wherein signal data collected in a flight for the third time is measurement data of the benchmark antenna.

2. The method for measuring the 4D radiation pattern of the outdoor antenna based on the UAV according to claim 1, wherein the calculating the optimal flight path for measurement for the UAV based on the user input information of the antenna to be tested comprises:
   calculating, by a measurement path planning unit, the optimal flight path for measurement for the UAV based on the user input information by using a Riemannian manifold, and generating, by the measurement path planning unit, an attitude command and GPS path data for the UAV.

3. The method for measuring the 4D radiation pattern of the outdoor antenna based on the UAV according to claim 2, wherein in the flying process of the UAV,
   generating, by a data command processing unit, a speed command based on the GPS path data and a received signal intensity in signal data currently collected; and
   regulating, by a UAV platform unit, a flying speed of the UAV based on the speed command, and pointing, by the UAV platform unit, the directional antenna of the UAV to the antenna phase center based on the attitude command and a pan-tilt-zoom (PTZ) direction.

4. The method for measuring the 4D radiation pattern of the outdoor antenna based on the UAV according to claim 1, wherein the converting, by the ground data processing unit, the corresponding GPS location data to the sampling location in the spherical coordinate system relative to the antenna phase center comprises:
   converting GPS coordinates in the corresponding GPS location data to geocentric Cartesian coordinates;
   converting the geocentric Cartesian coordinates to local Cartesian coordinates using the antenna phase center as an origin; and converting the local Cartesian coordinates to spherical coordinates using the antenna phase center as an origin, wherein the spherical coordinates are used as the sampling location.

5. The method for measuring the 4D radiation pattern of the outdoor antenna based on the UAV according to claim 1, comprising:

processing, by the ground data processing unit, the signal data to obtain the raw data corresponding to the measurement data of the antenna to be tested, the benchmark data corresponding to the measurement data of the benchmark antenna, and interference data corresponding to the background interference measurement data.

6. The method for measuring the 4D radiation pattern of the outdoor antenna based on the UAV according to claim 5, wherein the correcting, by the ground data processing unit, the raw data and the benchmark data comprises:

eliminating interference data from the raw data and the benchmark data by using the following formulas:

$$\overline{R_t(\zeta,i)} = 10 \lg\left(10^{\frac{R_t'(\zeta,i)}{10}} - 10^{\frac{\sigma(\zeta,i)}{10}}\right)$$

$$\overline{R_b(\zeta,i)} = 10 \lg\left(10^{\frac{R_b'(\zeta,i)}{10}} - 10^{\frac{\sigma(\zeta,i)}{10}}\right)$$

wherein $R_t'(\zeta,i)$, $\sigma(\zeta,i)$, $R_b'(\zeta,i)$ indicate three received signal intensities obtained at a frequency of $\zeta$ at an $i^{th}$ sampling location, and the three received signal intensities are measured in dBm and represent the raw data $R_t'(\zeta,i)$, the interference data $\sigma(\zeta,i)$, and the benchmark data $R_b'(\zeta,i)$, respectively; and $\overline{R_t(\zeta,i)}$, $\overline{R_b(\zeta,i)}$ indicate two received signal intensities obtained at the frequency of $\zeta$ at the $i^{th}$ sampling location and from which background interference is eliminated, wherein the two received signal intensities are measured in dBm and represent raw data from which background interference is eliminated and benchmark data from which background interference is eliminated, respectively.

7. The method for measuring the 4D radiation pattern of the outdoor antenna based on the UAV according to claim 6, wherein the correcting, by the ground data processing unit, the raw data and the benchmark data further comprises:

normalizing the raw data from which the background interference is eliminated and the benchmark data from which the background interference is eliminated by using the following formulas:

$$\overline{\overline{R_t(\zeta,i)}} = \overline{R_t(\zeta,i)} - \max\{\overline{R_t(\zeta,1)}, \ldots, \overline{R_t(\zeta,m)}\}$$

$$\overline{\overline{R_b(\zeta,i)}} = \overline{R_b(\zeta,i)} - \{\overline{R_b(\zeta,1)}, \ldots, \overline{R_b(\zeta,m)}\}$$

wherein m is a positive integer indicating a total number of sampling locations, $\overline{\overline{R_t(\zeta,i)}}, \overline{\overline{R_b(\zeta,i)}}$ indicate two normalized signal intensities obtained at the frequency of $\zeta$ at the $i^{th}$ sampling location, wherein the two normalized signal intensities represent normalized raw data from which the background interference is eliminated and normalized benchmark data from which the background interference is eliminated, respectively.

8. The method for measuring the 4D radiation pattern of the outdoor antenna based on the UAV according to claim 7, wherein the calibrating the corrected raw data based on the corrected benchmark data to obtain the discrete pattern data comprises:

calibrating, by using the following formula, the normalized raw data from which the background interference is eliminated based on the normalized benchmark data from which the background interference is eliminated, to obtain the discrete pattern data:

$$R_t(\zeta,i) = \overline{\overline{R_t(\zeta,i)}} - \overline{\overline{R_b(\zeta,i)}} + \overline{\overline{R_s(\zeta,i)}}$$

wherein $\overline{\overline{R_s(\zeta,i)}}$ indicates a normalized signal intensity corresponding to a standard pattern of the benchmark antenna at the frequency of $\zeta$ at the $i^{th}$ sampling location, $R_t(\zeta,i)$ indicates a normalized signal intensity corresponding to a spatial frequency discrete pattern of the antenna to be tested at the frequency of $\zeta$ at the $i^{th}$ sampling location, and $R_t(\zeta,i)$ indicates the discrete pattern data.

9. The method for measuring the 4D radiation pattern of the outdoor antenna based on the UAV according to claim 8, wherein the discrete pattern data is interpolated by a deep neural network, wherein the deep neural network is indicated by A (n|c; $\theta_a$) obtained after a plurality of times of iterative training performed on two deep neural networks A(n|κ; $\theta_a$) and B(d|c;$\theta_b$), n indicates a random variable subject to a standard Gaussian distribution $p_n(n)$, c indicates spatial frequency discrete pattern data used for training and subject to a distribution of $p_{data}$ (c), d indicates an output of the deep neural network A(n|c; $\theta_a$) or continuous pattern data used for training and subject to a distribution of $p_{data}$ (d), and $\theta_a$ and $\theta_b$ indicate node parameters in iteration.

10. A device for measuring the 4D radiation pattern of the outdoor antenna based on the UAV used in the method for measuring the 4D radiation pattern of the outdoor antenna based on the UAV according to claim 1, comprising:

a measurement path planning unit, configured to calculate a flight path for the UAV based on the user input information of the antenna to be tested;

a UAV platform unit, configured to control the flight of the UAV based on the flight path and collect the corresponding GPS location data;

a radiation signal acquisition unit, configured to receive a signal sent by each of the antenna to be tested and the benchmark antenna in each on-off state;

a data command processing unit, configured to regulate the flight of the UAV based on a received signal to enable the directional antenna of the UAV to point to the antenna phase center, and configured to collect the signal data; and the ground data processing unit, configured to convert the corresponding GPS location data to the sampling location in the spherical coordinate system, process collected signal data to obtain the raw data of the antenna to be tested and the benchmark data of the benchmark antenna, and obtain the spatial frequency 4D pattern data based on the raw data and the benchmark data, wherein the measurement path planning unit, the radiation signal acquisition unit, and the data command processing unit each are suspended from the UAV platform unit by using a pod.

11. The device for measuring the 4D radiation pattern of the outdoor antenna based on the UAV according to claim 10, wherein
the measurement path planning unit comprises a user input module, a path calculation module, and a control command module,
the user input module is configured to obtain the user input information;
the path calculation module is configured to calculate the optimal flight path for measurement and an attitude at each moment for the UAV based on the user input information; and
the control command module is configured to generate an attitude command based on the optimal flight path for measurement and the attitude.

12. The device for measuring the 4D radiation pattern of the outdoor antenna based on the UAV according to claim 11, wherein
the UAV platform unit comprises a GPS module, a flight control module, and a PTZ control module;
the data command processing unit comprises a speed regulation module and a data transmission module,
the data transmission module is configured to encapsulate real-time GPS location data collected by the GPS module and demodulated data of a signal received by the radiation signal acquisition unit into a data frame, and send the data frame to the ground data processing unit over a radio link;
the PTZ control module is configured to receive the attitude command, and the speed regulation module is configured to receive the optimal flight path for measurement;
the flight control module is configured to receive a speed command generated by the speed regulation module based on a signal intensity sent by the radiation signal acquisition unit;
the flight control module is configured to control a flying speed and a direction of the UAV based on the speed command received in real time; and
the PTZ control module is configured to control an attitude or a direction of the directional antenna on the UAV in real time based on GPS location data sent by the GPS module and the attitude command; and
the radiation signal acquisition unit comprises the directional antenna and a broadband signal receiver configured to demodulate a signal received by the directional antenna.

13. The device for measuring the 4D radiation pattern of the outdoor antenna based on the UAV according to claim 12, wherein
the ground data processing unit comprises a data receiving module, a data processing module, a data correction module, and a pattern generation module,
the data processing module is configured to receive, by using the data receiving module, a signal sent by the data transmission module and comprising the signal data and the corresponding GPS location data;
the data processing module is configured to demodulate a signal sent by the data transmission module, perform a coordinate conversion on the demodulated data, and send converted data to the data correction module;
the data correction module is configured to eliminate background interference, calibrate data, and send calibrated data to the pattern generation module; and
the pattern generation module is configured to calculate E-plane and H-plane pattern data for the antenna to be tested, and reconstruct the spatial frequency 4D pattern data based on the E-plane and H-plane pattern data.

\* \* \* \* \*